United States Patent
Arnz et al.

(10) Patent No.: US 8,369,605 B2
(45) Date of Patent: Feb. 5, 2013

(54) METHOD AND APPARATUS FOR DETERMINING THE POSITION OF A STRUCTURE ON A CARRIER RELATIVE TO A REFERENCE POINT OF THE CARRIER

(75) Inventors: Michael Arnz, Oberkochen (DE); Gerd Klose, Oberkochen (DE); Michael Totzeck, Schwaebisch Gmuend (DE)

(73) Assignee: Carl Zeiss SMS GmbH, Jena (DE)

( * ) Notice: Subject to any disclaimer, the term of this patent is extended or adjusted under 35 U.S.C. 154(b) by 735 days.

(21) Appl. No.: 12/518,288

(22) PCT Filed: Nov. 20, 2007

(86) PCT No.: PCT/EP2007/010047
§ 371 (c)(1),
(2), (4) Date: Dec. 1, 2009

(87) PCT Pub. No.: WO2008/071296
PCT Pub. Date: Jun. 19, 2008

(65) Prior Publication Data
US 2010/0104128 A1    Apr. 29, 2010

Related U.S. Application Data

(60) Provisional application No. 60/870,319, filed on Dec. 15, 2006.

(30) Foreign Application Priority Data

Dec. 15, 2006 (DE) .......................... 10 2006 059 431

(51) Int. Cl.
*G06K 9/00* (2006.01)
(52) U.S. Cl. ..................................... 382/151
(58) Field of Classification Search ............... 382/151
See application file for complete search history.

(56) References Cited

U.S. PATENT DOCUMENTS

| | | | |
|---|---|---|---|
| 5,365,072 A * | 11/1994 | Turner et al. | 250/491.1 |
| 6,920,249 B2 | 7/2005 | Rinn et al. | |
| 7,181,057 B2 * | 2/2007 | Adel et al. | 382/144 |
| 8,138,498 B2 * | 3/2012 | Ghinovker | 257/48 |
| 2006/0197950 A1 * | 9/2006 | Smith et al. | 356/401 |

FOREIGN PATENT DOCUMENTS

| | | |
|---|---|---|
| WO | WO 01/09927 | 2/2001 |
| WO | WO 02/097535 | 12/2002 |

OTHER PUBLICATIONS

International Search Report for International Serial No. PCT/EP2007/010047 dated Mar. 14, 2008.

* cited by examiner

*Primary Examiner* — Roy M Punnoose
(74) *Attorney, Agent, or Firm* — Fish & Richardson P.C.

(57) ABSTRACT

A method is provided for determining the position of a structure on a carrier, relative to a reference point of the carrier, said method comprising the steps of: a) providing an image including a reference structure; b) recording an image of the structure on the carrier by means of a recording device, with a known recording position relative to the reference points; c) superimposing the two images to form one superimposed image; d) determining the image distance of the two structures in the superimposed image; e) shifting the two structures in the superimposed image relative to one another, depending on the determined image distance; f) checking whether the determined image distance is below a predetermined maximum value; wherein, if the image distance is below the maximum value, the method is continued in step g), and, if the image distance is not below the maximum value, steps d)-f) are repeated, taking into account the determined image distance/distances: g) determining the position of the structure relative to the reference point, on the basis of the recording position in step b) and of the image distance/image distances determined in step(s) d).

22 Claims, 5 Drawing Sheets

METHOD AND APPARATUS FOR DETERMINING THE POSITION OF A STRUCTURE ON A CARRIER RELATIVE TO A REFERENCE POINT OF THE CARRIER

This application is the National Stage International Application No. PCT/EP2007/010047, filed on Nov. 20, 2007, which claims priority to German Patent Application Serial No. 10 2006 059 431.2, filed on Dec. 15, 2006 and U.S. Provisional Application Ser. No. 60/870,319, filed on Dec. 15, 2006. The contents of the above-referenced applications are hereby incorporated by reference in their entireties.

The present invention relates to an apparatus and a method for determining the position of a structure on a carrier relative to a reference point of the carrier. Said structure may be, in particular, a mark on a lithographic mask (carrier).

A method and a measurement apparatus for determining the position of an edge of a pattern element on a substrate are known from U.S. Pat. No. 6,920,249 B2. According to said method, a one-dimensional profile of the pattern edge to be determined is compared with a model intensity profile that has sub-pixel accuracy in order to determine the site of the best fit of the pattern edge to be measured.

In view thereof, it is an object of the invention to provide a method and an apparatus for determining the position of a structure on a carrier relative to a reference point of the carrier, allowing to determine the position with higher precision.

The object is achieved by a method having the features of claim 1. Since the method iteratively determines the image distance by shifting both structures within the superimposed image, until said distance is below a predetermined maximum value, this allows to achieve considerably higher precision in determining the position of the structure on the carrier from the iteratively determined image distance and the known recording position. Thus, a maximum relative pixel error=0.7% is possible.

In the individual iteration loops (steps d-f of claim 1) either the already shifted structures can be shifted again, or the original structures can always be shifted. This depends, for example, on whether shifting is effected by the image distance continuously determined anew or by the accumulated image distance.

The method may be improved in accordance with dependent claims 2 to 9.

The reference structure and the recorded structures preferably have the same shape and, in particular the same size. The structure on the carrier may be, for example, a measurement mark on the carrier provided as a lithographic mask.

Further, a method for determining the width of a structure having a left and a right edge on a carrier is provided according to claim 10. This method allows to determine the width of the structure with extremely high precision. Advantageous improvements are given in dependent claims 11 to 18.

The structure may be, in particular, a line-shaped structure whose width is smaller than its length. The terms "left and right edge" are not to be construed as limiting, but merely refer to a first and a second edge of the structure.

The maximum value for the right and left edges may be the same or different. Preferably, it is the same for both edges.

Further, an apparatus for determining the position of a structure on a carrier relative to a reference point of the carrier is provided according to claim 19. This method allows the position to be determined with very high precision.

Furthermore, an apparatus for determining the width of a structure having a left and a right edge on a carrier is provided according to claim 20. This apparatus enables high-precision width determination.

The apparatus of claim 19 may be improved such that it can execute the method steps of dependent claims 2 to 9.

The apparatus of claim 20 may be improved such that it can execute the method steps of claims 11 to 18.

The apparatuses of claims 19 and 20 may comprise, in particular, a recording device for recording an image of the structure on the carrier.

Further, a position determining mark is provided, which has a greater overall length of the edges as compared to a previously known mark comprising two intersecting, line-shaped portions which define a surrounding surface region. The surrounding surface region means that surface region into which the previously known mark can still just about be inscribed.

Such a mark is advantageous for position determination, because the greater overall length of the edges causes spatial averaging across the mark, so that the precision in position determination is increased.

The mark is, in particular, a mark for a lithographic mask or for a semi-conductor wafer.

For example, the mark may comprise several elbow structures (L-shaped) whose size increases. The mark may comprise, for example, several nested, ring-shaped structures. In particular, the mark may comprise several concentric circles. It may also be provided as a grid respectively comprising several line-shaped portions in two different directions. The line-shaped portions of the two different directions intersect each other.

In particular, the mark is suitable as a structure for one of the above-described methods.

It is evident that the features mentioned above and those mentioned below, which are yet to be explained, can be used not only in the combinations mentioned, but also in any other combinations, or alone, without departing from the scope of the present invention.

The invention will be explained in more detail below, by way of example and with reference to the enclosed Figures, which also disclose essential features of the invention. In the drawings.

Figure 1:
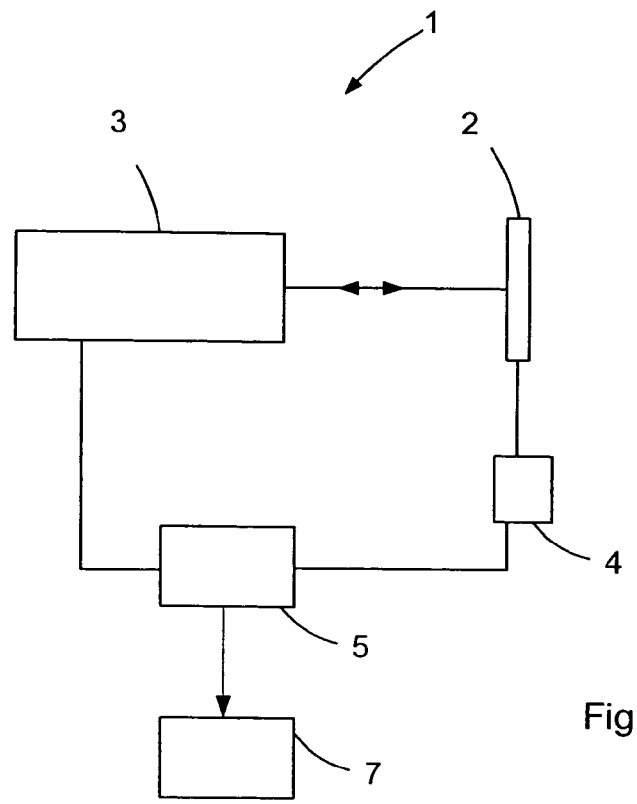
FIG. 1 shows a schematic view of a measurement apparatus 1 as well as of the evaluation apparatus 7 according to the invention.
Figure 10:
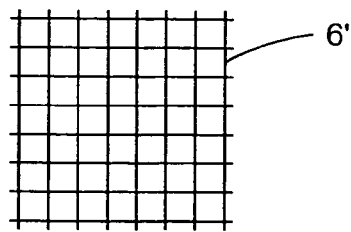
Figure 3:
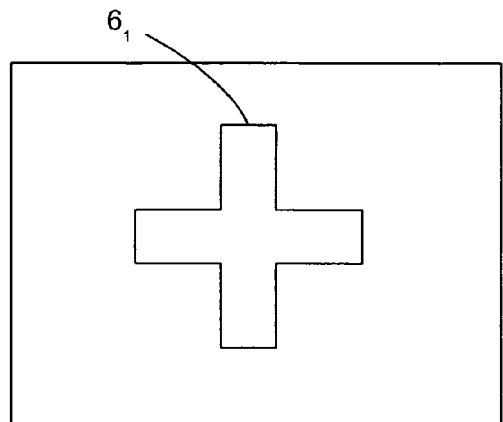
FIG. 3 shows an image 8 of a first structure $6_1$.
Figure 4:
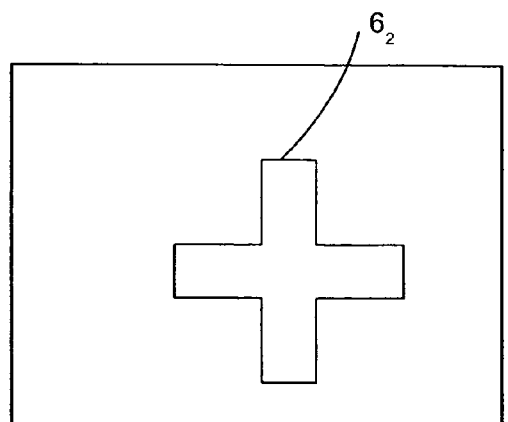
FIG. 4 shows an image 9 of a second structure $6_2$.
Figure 5:
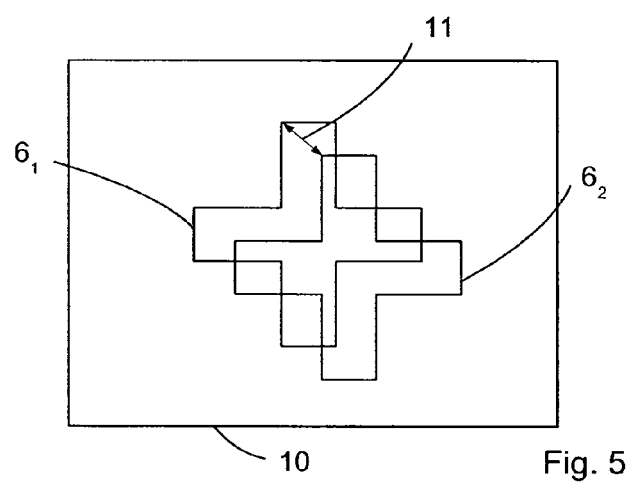
Figure 6:
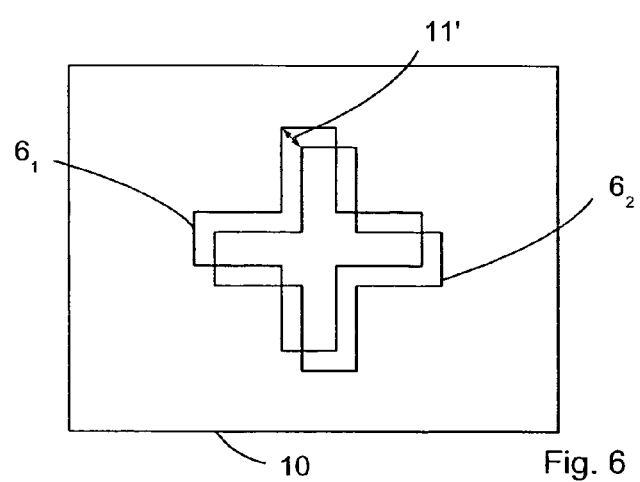
Figure 7:
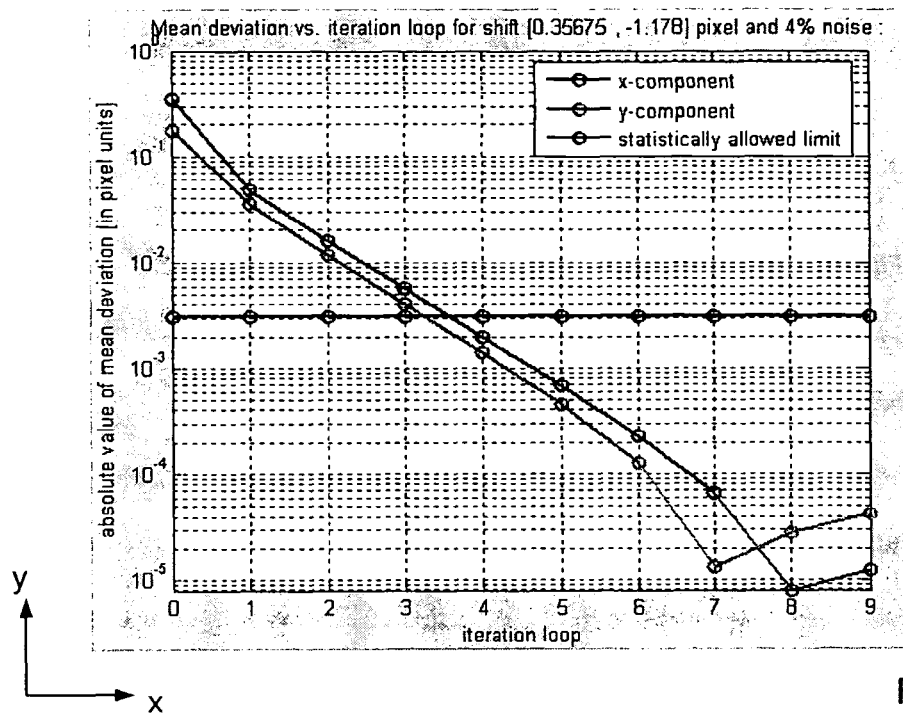
Figure 8:
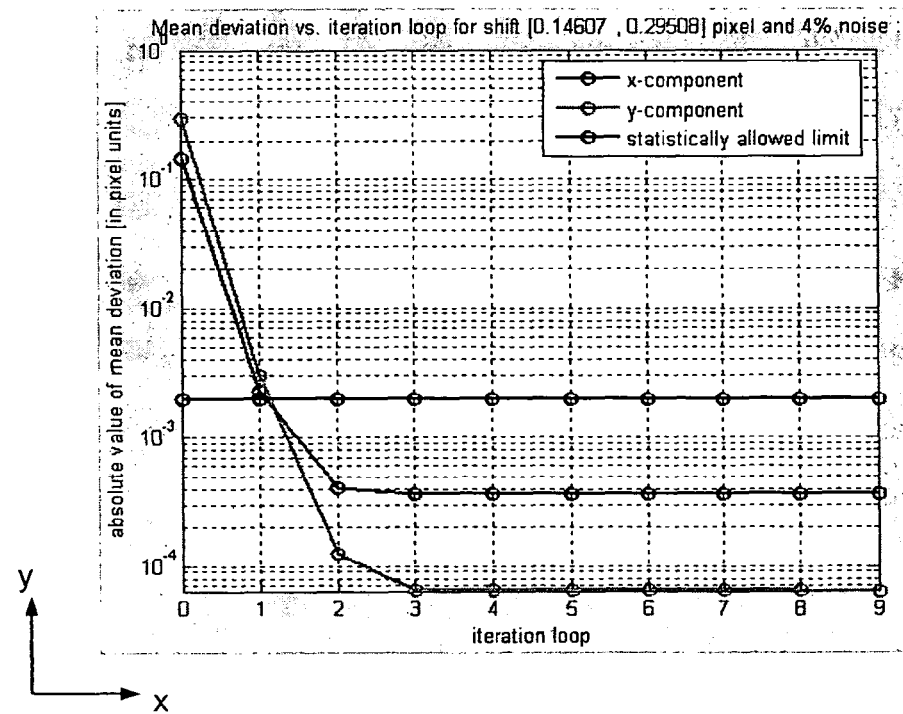
Figure 9:
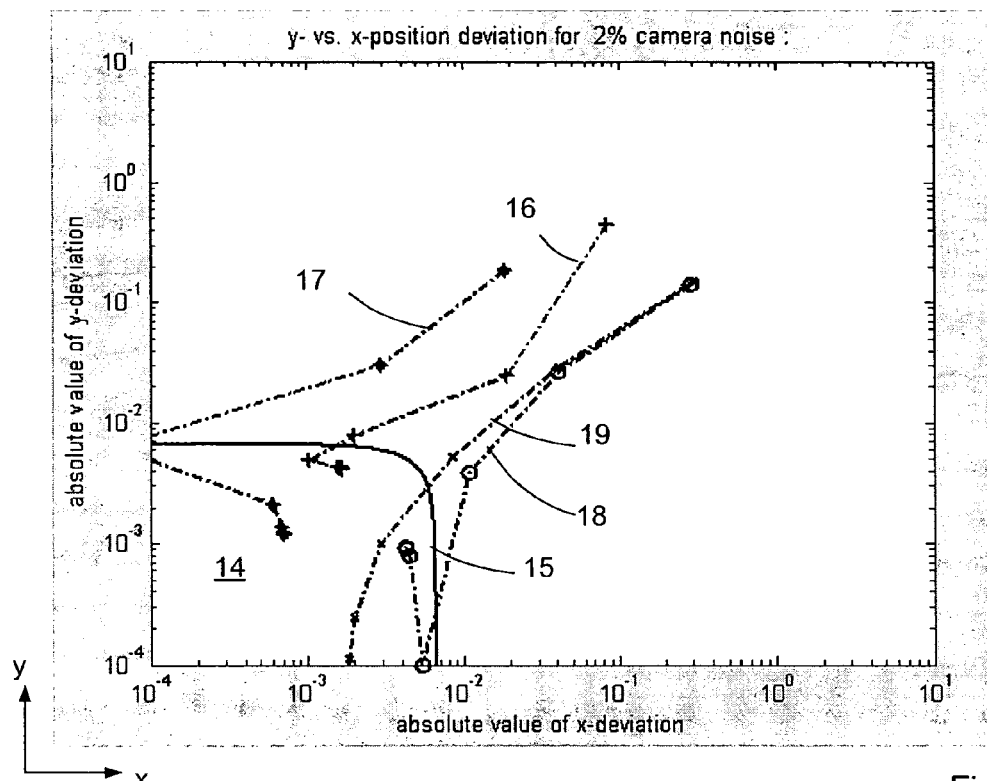
Figure 11:
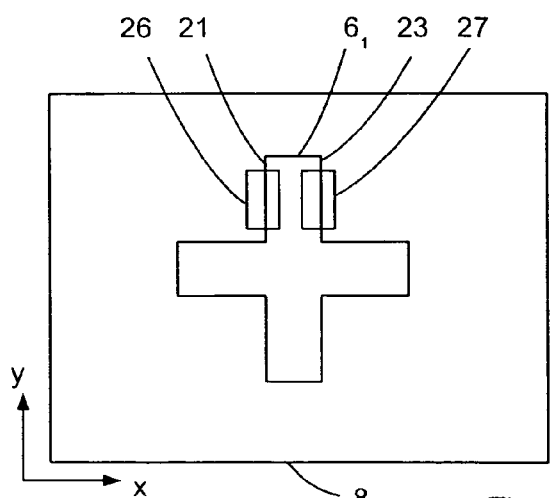
Figure 12:
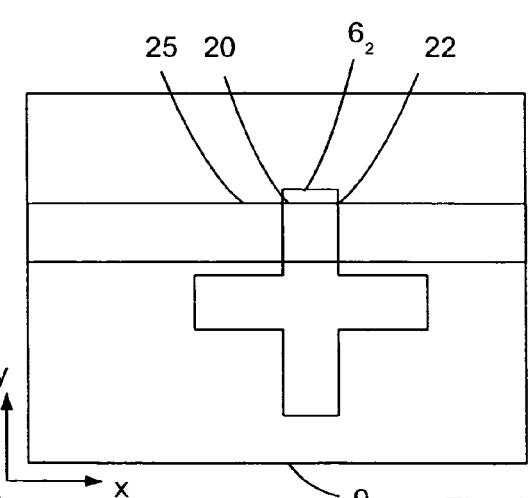
Figure 13A:
Figure 13B:
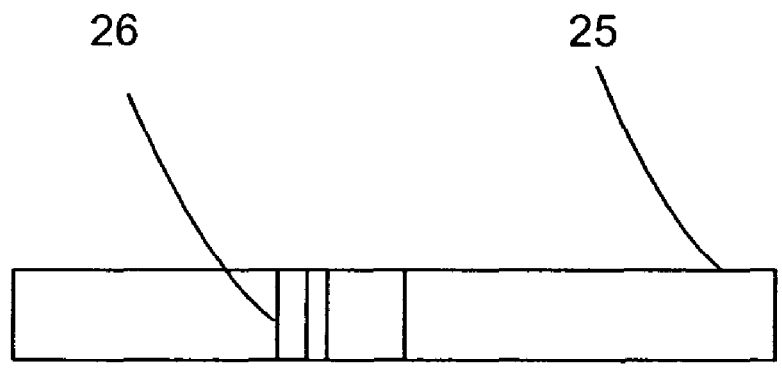
Figure 13C:
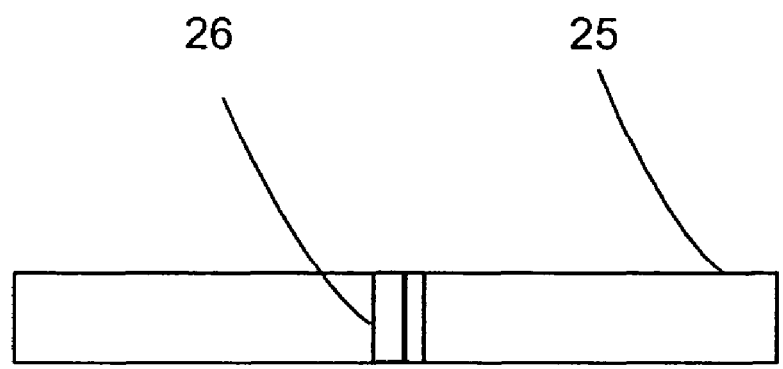

FIG. 5 shows a superimposed image 10 of the images 8 and 9 of FIGS. 3 and 4;

FIG. 6 shows the superimposed image 10 of FIG. 5, wherein the structure $6_2$ is shifted relative to the structure $6_1$;

FIG. 7 shows a diagram indicating the absolute value of the standard deviation in pixel units plotted versus the number of iteration loops according to the first variant (step 4a) of the method according to the invention for determining the position of a structure on a carrier relative to a reference point of the carrier;

FIG. 8 shows a diagram indicating the absolute value of the standard deviation in pixel units plotted versus the number of iteration loops according to the second variant (step 4b) of the method according to the invention for determining the position of a structure on a carrier relative to a reference point of the carrier;

FIG. 9 shows a diagram explaining how many iteration loops are needed to achieve the desired precision;

FIG. 10 shows an alternative form of the structure 6 of the lithographic mask 2 of FIG. 1;

FIG. 11 shows an image 8 of the structure $6_1$ for determining a width of the structure;

FIG. 12 shows an image 9 of the structure $6_2$ for determining a width of the structure, and FIGS. 13a-13c are Figures explaining the line-width determination.

FIG. 1 schematically shows a measurement apparatus 1 for measuring a lithographic mask 2 (or a carrier 2, respectively). The measurement apparatus 1 comprises a recording device 3, by which an enlarged image of portions of the lithographic mask 2 can be recorded (e.g. by means of a CCD detector, not shown); a positioning device 4, which can adjust the position or location, respectively, of the lithographic mask 2 relative to the recording device 3 in a controlled manner; as well as a control device 5 for controlling the measurement apparatus.

Figure 2:
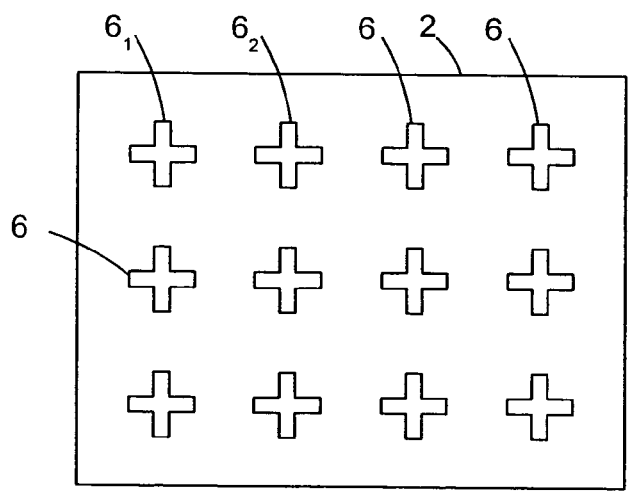
FIG. 2 shows a top view of the lithographic mask 2 of FIG. 1.

FIG. 2 shows a schematic top view of the lithographic mask 2. The lithographic mask 2 includes a multiplicity of (test) structures 6, which e.g. have a cross shape here. For example, the test structures 6 serve to check and/or adjust the lithographic mask 2. FIG. 2 shows them strongly enlarged. For a mask size of ca. 100 mm×150 mm, the structures 6 have a size of ca. 10 μm. Between the test structures 6, there are the mask structures relevant for exposure, which are not indicated here for reasons of a simplified representation.

When testing the mask, the structures 6 are e.g. sequentially recorded by means of the recording device 3, with the positioning device 4 moving and positioning the lithographic mask 2 relative to the recording device 3 with high precision for each recording. The image data of the individual recordings, which are generated e.g. by the CCD detector with detection pixels arranged in lines and columns, as well as the position data of the positioning device 4 are supplied to the control device 5. The control device 5 transmits these data to an evaluation device 7 according to the invention.

On the basis of two images of two adjacent structures 6, for example, the evaluation device 7 determines the distance between the structures 6 on the lithographic mask 2, which determination is effected with sub-pixel precision with respect to the pixel size of the detector of the recording device 3.

In order to achieve this resolution, the iterative evaluation method described below is carried out.

In a first step, the evaluating device 7 receives the image data or the image 8, respectively, of a first structure $6_1$ from the control device 5 (FIG. 3). Further, the evaluating device 7 also receives the image 9 of a structure $6_2$ adjacent to the structure $6_1$ of the image 8 on the lithographic mask (FIG. 4) and information on the shift which the positioning device 4 has effected between the recordings of the images 8 and 9 in the recording plane of the recording device (i.e. on the lithographic mask 2).

The evaluating device 7 superimposes both images 8, 9 to form one superimposed image 10, as schematically shown in FIG. 5. This may be effected, for example, by definition of an identical coordinate system for both images 8, 9. Then, the distance 11 of both structures $6_1$ and $6_2$ in the superimposed image 10 is determined.

The evaluating device 7 shifts the structure $6_2$ in the superimposed image 10 by the image distance 11, electronically or with respect to the image data, respectively, and not in reality.

Subsequently, it is checked whether the image distance 11 is below a predetermined maximum value. If this is not the case, as schematically shown in FIG. 6 with clearly exaggerated dimensions, the image distance 11' between the structure $6_1$ and the shifted structure $6_2$ is determined, in turn, and the shifted structure $6_2$ is shifted again in the superimposed image 10, this time by the determined image distance 11'.

Subsequently, it is checked again whether the image distance 11' is below the predetermined maximum value. If this is not the case, the steps described in connection with FIG. 6 are carried out again. If the subsequent verification of the amount of the determined image distance shows that the image distance is below the maximum value, no further image distances are determined and no further shifts are carried out.

The hitherto determined image distances and the known shift of the positioning device 4 between the recordings of the images 8 and 9 then allow the distance between the two structures $6_1$ and $6_2$ on the lithographic mask 2 to be determined with high precision.

The described steps can be realized, for example, as follows:

First of all, the Fourier spectrum is determined for both images 8, 9 (FIG. 3, FIG. 4) (step 1).

In order to determine the image distance 11, the two-dimensional correlation between the two images 8 and 9 is then computed (step 2) according to the following formula (1)

$$C_{m,n} = \text{Re}\left(\frac{1}{P \cdot Q}\sum_{p=1}^{P}\sum_{q=1}^{Q}\hat{a}_{p,q} \cdot b_{p,q}^{*} \cdot (\mu_p)^{1-m} \cdot (v_q)^{1-n}\right) \quad (1)$$

$$= \sum_{m'=1}^{P}\sum_{n'=1}^{Q}\hat{A}_{m',n'} \cdot B_{m'+1-m,n'+1-n}$$

wherein, in the ideal case, $B_{m,n} \propto \hat{A}_{m,n}$, and the maximum is m=1=n, with the image shifted according to $$\hat{A}_{m,n} \equiv \text{Re}\left(\sum_{m=1}^{P}\sum_{n=1}^{Q}\hat{a}_{p,q} \cdot (\mu_p)^{1-m} \cdot (v_q)^{1-n}\right). \quad (2)$$

Further, it is assumed that the detector comprises P pixel lines and Q pixel columns, with the phasors being defined as follows $$\mu_p = e^{-2\pi i \cdot \eta_p}, p=1 \ldots P \quad (3)$$

$$v_q = e^{-2\pi i \cdot \xi_q}, q=1 \ldots Q \quad (4)$$

with the following coordinates $$\eta_p = \frac{p-1}{P} - \text{floor}\left(\frac{p-1}{P} + \frac{1}{2}\right) \quad (5)$$

$$\xi_q = \frac{q-1}{Q} - \text{floor}\left(\frac{q-1}{Q} + \frac{1}{2}\right). \quad (6)$$

The floor function returns the greatest integer of the argument, which is less than or equal to the argument.

In a subsequent step (step 3), those whole pixels ($\hat{m} \neq 1$, $\hat{n} \neq 1$) are then determined for which the correlation is at a maximum ($\hat{C} = C_{\hat{m},\hat{n}}$).

In the following step 4, the sub-pixel image distance (Δx, Δy) is determined. Two alternatives for this step are described hereinafter.

According to a first alternative (step 4a), the so-called anti-symmetry of the correlation matrix will be minimized. For this purpose, the squared differences ($C_{m,n} - C_2 \cdot \hat{m} - m$, $2\cdot\hat{n}-n)^2$ are added, with respect to a center of symmetry $(\hat{m},\hat{n})$ for each pixel $(m,n)$ and the corresponding reflected pixel $(2\cdot\hat{m}-m,2\cdot\hat{n}-n)$, and referred to as $AoC_{\hat{m},\hat{n}}$.

Then, $AoC_{\hat{m}\pm1,\hat{n}\pm1}$ is computed, wherein adjacent pixels are used as the center.

The two-dimensional sub-pixel image distance ($\Delta x \approx \hat{n}-1$, $\Delta y \approx \hat{m}-1$) is then determined by means of a parabola fit or parabola interpolation, respectively, near the extremum $m=\hat{m}$, $n=\hat{n}$.

According to the second alternative (step 4b) of step 4, the correlation $C_{m,n}$ for the pixels $m=\hat{m},\hat{m}\pm1$ and $n=\hat{n},\hat{n}\pm1$ can be used directly to determine the sub-pixel image distance ($\Delta x$, $\Delta y$). In this case, the maximum of the correlation is determined by a parabola fit near the extreme value $m=\hat{m}$, $n=\hat{n}$.

The sub-pixel deviation ($\Delta x$, $\Delta y$) determined in step 4a or 4b is added to the already present total displacement $x_{total}$ or $y_{total}$, respectively, (step 5) so as to compute a new total displacement $x_{total}$, $y_{total}$.

$$x_{total} \rightarrow x_{total} + \Delta x; y_{total} \rightarrow y_{total} + \Delta y \qquad (7)$$

In the first run of step 4, the already present total displacement is the displacement of $(\hat{m},\hat{m})$ to $(1,1)$. In the subsequent iteration loops, the already present total displacement is, of course, always the total displacement computed in step 5 of the preceding iteration loop.

This total displacement is used (step 6) to generate the phase tilt of the spectrum by multiplication $$\hat{a}_{p,q} = a_{p,q} \cdot (\mu_p)^{-y_{total}} \cdot (\nu_q)^{-x_{total}} \qquad (8)$$

Subsequently, it is examined whether the sub-pixel displacement $\Delta x$, $\Delta y$ is below a predetermined maximum value (step 7). If this is not the case, the correlation $C_{m,n}$ is computed again, according to the above formula 1, using the phase tilt according to formula 8 (step 8), which corresponds to the mutual displacement of the two structures $6_1$, $6_2$ by the total displacement determined in step 5.

Then, steps 4-7 are repeated, without having to effect shifting by whole pixels (step 3) any more. In the newly executed step 6, the new total shift is, of course, applied again to the structure $6_2$ in the superimposed image 10 of FIG. 5. The result of this is the same as a shift of the already shifted structure $6_2$ (in FIG. 6) only by the newly computed sub-pixel image distance. In this case, the formula (7) is to be replaced by the following formula (7')

$$x_{total} = \Delta x, y_{total} = \Delta y \qquad (7').$$

Steps 8 and 4-7 are repeated until the sub-pixel shift is found to be sufficiently small in step 7.

If this is the case, no further iteration is carried out, and the total shift or the total image distance ($x_{total}$, $y_{total}$), respectively, between the two images 8, 9 is output in step 9, allowing to determine, together with the known shift in the recording plane, the distance between the structures $6_1$ and $6_2$ on the lithographic mask 2.

In the above-described first alternative (step 4a, minimizing the anti-symmetry), weighting may be optionally included in addition, which weighting decreases as the distance from the maximum correlation ($\hat{m},\hat{n}$) increases.

In the second alternative, the maximum of the correlation can be computed, for example, by a Taylor series around the maximum. As an alternative, it is possible to compute the maximum by least squares polynomial fitting.

In FIG. 7, the absolute value of the mean deviation for the first variant is plotted in pixel units (along the y-axis) versus the number of iteration loops (along the x-axis), with the x-component and the y-component being shown separately. The values for FIG. 7 were obtained from a simulation calculation, wherein the following was carried out for each number of iteration loops. An existing image was shifted by a known value, and then the distance was computed by the above steps and by the corresponding number of iteration loop, and the deviation from the known shift value was computed. This was done n times for each number of the plotted iteration number, and, in doing so, the 4% noise was randomly determined anew each time. The mean value (mean deviation) of all the thus-computed deviations for the corresponding iteration number was computed and plotted. Further, the statistically allowed limit (statistically allowed limit=uncertainty of the mean value $$\sigma \sim \frac{1}{\sqrt{n}})$$

is plotted. This representation shows that, as of the fourth iteration, the determined deviation is below the statistical limit.

A corresponding representation for the second variant is shown in FIG. 8. It is evident therefrom that the absolute value is below the statistical limit already as of the second iteration. This comparison shows that the second method leads to better results in a shorter time.

It is also immediately apparent from FIGS. 7 and 8 that, at a greater pixel number, the absolute error in determining the distance on the lithographic mask decreases, of course. Thus, in the first variant, e.g. in a detector of 512×512 pixels, which records a 20×20 µm area on the lithographic mask 2, an absolute error of not greater than 0.4 nm can be reached even at a noise level of the detector of up to 2%, although every single pixel of the detector records an area of ca. 39×39 nm. This corresponds to a maximum error of 1% with respect to one pixel (relative pixel error). In the second variant, a maximum relative pixel error of 0.7% is achieved under otherwise identical conditions.

In particular, it has turned out that the relative pixel error, normalized with the pixel size, is independent of the pixel size. Thus, the relative pixel error (not normalized) is inversely proportional to the pixel number or directly proportional to the pixel size of the detector, respectively.

According to an improvement, several recordings of the structure $6_2$ can be made with different focuses, so that several images 9 having correspondingly different focuses are present. For each of these images 9, the above-described iterative image distance determination is carried out.

Further, the best focus is determined from said images 9. This may be determined, for example, from the position of the structure $6_2$ in the image 9 by two-dimensional correlation and/or a contrast criterion (for example, edge steepness).

The maximum of the correlation of the two-dimensional position in the image can be determined by a parabola fit. However, it has turned out that a parabola fit with respect to the contrast criterion is more sensitive to defocusing. In this case, an astigmatism, in particular, can also be taken into account, because edges in the x direction and edges in the y direction can be analyzed for steepness and fitted with respect to the focus.

If the above-determined image distances for the recordings of the structure $6_2$ are plotted with different focuses depending on the focusing and are suitably interpolated, the most precise image distance possible (having the smallest error) can be derived for the best focus determined.

FIG. 9 schematically shows again how, with analogy to FIGS. 7 and 8, the error of the image distance in the x and y directions is within the required precision after two to three iterations during a simulation; lower left corner region 14 in FIG. 9, which is separated by the solid line 15 (=statistically allowable limit). In FIG. 9, the absolute error is plotted along the x axis in pixel units in the x direction and the absolute error in the y direction is plotted along the y direction, which plotting is effected logarithmically in both cases. Various simulations 16, 17, 18, 19 for the second variant are shown, taking into account a camera noise of 2%. It is evident from the representation in FIG. 9 that the desired range of accuracy is achieved at the latest after three iterations (iteration loops).

Of course, the structures 6 need not be provided as crosses, as has been previously assumed. It has been shown that structures having more edges lead to better results. Thus, for example, the grid structure 6' shown in FIG. 10 may be employed. This structure 6' may be particularly provided such that it uses up the same surface area as the cross structures 6. With analogy thereto, concentric circles, nested elbow structures or other nested structures (e.g. rectangular, semicircles, . . . ) are possible.

The above-described iterative method can be used not only to determine the distance between two equal structures (registration), but also, for example, for high-precision measurement of a line width.

For this purpose, the image distance from the left edge 20 of the structure 6₂ (FIG. 12) to the left edge 21 of the structure 6₁ (FIG. 11) is determined. Then, the distance from the right edge 22 of the structure 6₂ to the right edge 23 of the structure 6₁ is determined, with the distance between the edges 21 and 23 being known.

First of all, the determination of the image distance between the left edges 20, 21 will be described. First, after determining the center of gravity, a two-dimensional rectangular region 25 (which may also be called global ROI, for example) is selected for the left edge 20 with the coordinates $\tilde{c}_{m=1\ldots M, n=1\ldots N}$, wherein M designates the lines (in the y direction) and N designates the columns (in the x direction). In doing so, no averaging is carried out along the longitudinal direction of the edge 20, so as to maintain the full contrast in case of a slight rotation of the structure 6₂ on the image 9. Here, the global ROI 25 extends over the entire expansion of the image 9 in the x direction.

Subsequently, a two-dimensional region 26 (which may also be called left ROI, for example) of the left edge 21 of the structure 6₁ is selected (e.g. by determining the center of gravity), which is smaller than the region 25. The region 26 comprises the coordinates $\tilde{a}_{m=1\ldots M, j=1\ldots J}$, wherein the number of lines M (expansion in the y direction) is equal and the number of columns J (in the x direction) is smaller than in the region 25 having the number of columns N.

Then, the weighted sum of the squared differences between the two edge regions 25 and 26 is defined as a merit function $\hat{\Sigma}_k(\gamma)$ as follows $$\hat{\Sigma}_k(\gamma) = \sum_{m=1}^{M} \sum_{j=1}^{J} \omega_{m,j} \cdot (\tilde{a}_{m,j} - \gamma \cdot \tilde{c}_{m,k+j-1})^2 \bigg/ \sum_{m=1}^{M} \sum_{j=1}^{J} \omega_{m,j} \cdot \tilde{a}_{m,j}^2 \quad (9)$$

with $$k = 1 \ldots 1 + N - J; \quad (10)$$

$$x_k = k - 1 - \text{floor}\left(\frac{1 + N - J}{2}\right).$$

The edge finding algorithm is realized as a two-stage optimizing method. First of all, the merit function is locally minimized by optimally selecting the local scale γ (for a modulation adjustment of the two images 8 and 9).

$$\Sigma_k \equiv \min(\hat{\Sigma}_k(\gamma)) = 1 - \kappa_k^2 \quad (11)$$

with $$\kappa_k \equiv \sum_{m=1}^{M} \sum_{j=1}^{J} \omega_{m,j} \cdot \tilde{a}_{m,j} \cdot \tilde{c}_{m,k+j-1} \bigg/ \sqrt{\left(\sum_{m=1}^{M} \sum_{j=1}^{J} \omega_{m,j} \cdot \tilde{a}_{m,j}^2\right) \cdot \left(\sum_{m=1}^{M} \sum_{j=1}^{J} \omega_{m,j} \cdot \tilde{c}_{m,k+j-1}^2\right)} \quad (12)$$

wherein $\kappa_k \leq 1$ due to the Schwarz inequality.

Optimizing the local scale enables efficient fitting of $\tilde{c}_{m=1\ldots M, n=k\ldots k+J-1}$ relative to $\tilde{a}$, even if the images 8 and 9 are based on different modulations. For example, the weighting matrix ω can be used to suppress the transition region of the edge (that is, the central edge region), which leads to a higher reproducibility of the method depending on the edge width. However, other weightings are also possible.

Subsequently, global minimizing by means of a parabola fit around the minimum of the curve $\{x_k, \Sigma_k\}$ is carried out. If $\hat{k}$ is the pixel at which $\Sigma_k$ becomes minimal ($\Sigma_{\hat{k}} \leq \Sigma_k$), a parabola fit through the three points $\{\hat{k}-1, \hat{k}, \hat{k}+1\}$ will lead to a vertex position (minimum) at $\hat{x} = x_{\hat{k}} + \Delta x$ with a remaining sub-pixel image distance $$\Delta x = \frac{1}{2} \cdot \frac{\Sigma_{\hat{k}+1} - \Sigma_{\hat{k}-1}}{2\Sigma_{\hat{k}} - \Sigma_{\hat{k}+1} - \Sigma_{\hat{k}-1}}.$$

This approach can also be described such that the left ROI 26 is electronically shifted relative to the global ROI 25, as indicated in FIGS. 13a-13c, until the minimum sub-pixel image distance Δx has been determined. The two ROIs 25, 26 can thus be understood to be a superimposed image, in which the relative shift is carried out, which is only a one-dimensional shift here (in contrast to the above-described two-dimensional shift in the case of registration).

Using the above-described two-stage optimization method, the reference edge or the region 26, respectively, is shifted relative to the edge 20 to be measured or to the region 25 to be measured, respectively, and in doing so, the position or the image distance Δx, respectively, of the best fit is determined.

The two-stage edge finding algorithm is then repeated until Δx is below a predetermined threshold value (the iteration converges).

The distance between the left edges 20, 21 on the lithographic mask 2 can be computed from the respectively determined Δx.

Then, the described steps are carried out for the right edges 22 and 23, i.e. for a right ROI 27, which includes part of the right edge 23 (FIG. 11), and the global ROI 25. The line width (i.e. the distance between the edges 20 and 22 of the structure 6₂) can then be determined from the thus-determined edge distances for a known distance between the edges 21, 23.

Even when determining the line width, multiple recordings can be made of the structure 6₂ with different focuses, and the line width for the determined best focus can be computed in the same manner as in the above-described registration measurement.

The image 8 comprising the structure 6₁ can also be understood as an image comprising a reference structure. The structure 6₁ may define a reference point of the carrier 2 (or of the lithographic mask, respectively). As described, the reference structure may be generated by recording a structure 6₁. However, it is also possible to generate the reference structure 6₁ by recording a multiplicity of structures 6 of the lithographic mask 2, superimposing them and averaging them so as to obtain an optimum (e.g. low-noise) reference structure. Further, it is possible to determine the reference structure numerically or by simulations, respectively. The statements made in this paragraph with respect to the structure 6₁ or reference structure, respectively, and to the reference point apply to all embodiments described, in particular to the registration measurement and to the line width measurement. Moreover, the features of the described embodiments can be combined where useful.

The invention claimed is:

1. A method for determining the position of a structure on a carrier, relative to a reference point of the carrier, said method comprising the steps of:
   a) providing an image including a reference structure;
   b) recording an image of the structure on the carrier by means of a recording device, with a known recording position relative to the reference points;
   c) superimposing the two images to form one superimposed image;
   d) determining the image distance of the two structures in the superimposed image;
   e) shifting the two structures in the superimposed image relative to one another, depending on the determined image distance;
   f) checking whether the determined image distance is below a predetermined maximum value;
   wherein, if the image distance is below the maximum value, the method is continued in step g),
   and, if the image distance is not below the maximum value, steps d)-f) are repeated, taking into account the determined image distance/image distances;
   g) determining the position of the structure relative to the reference point, on the basis of the recording position in step b) and of the image distance/image distances determined in step(s) d).

2. The method as claimed in claim 1, wherein the image distance is determined in step d) by means of a two-dimensional correlation.

3. The method as claimed in claim 2, wherein in step d) a correlation matrix is computed and the image distance is determined by minimizing the anti-symmetry of the correlation matrix.

4. The method as claimed in claim 2, wherein in step d), in order to determine the image distance, the absolute maximum of correlation is determined by an approximation method.

5. The method as claimed in claim 1, wherein in step b) several images of the structure are recorded with different focuses, and
   steps c)-f) are carried out for each of the recorded images, wherein in step g) the position of the structure relative to the reference point is determined on the basis of the recording position in step b) and of the image distances determined in steps d) for all images of the structure with the different focuses.

6. The method as claimed in claim 5, wherein in step g) an optimum focus position for the recording of the structure is derived from the images of the structure, and the position of the structure is determined from the image distances determined in steps d), taking into account the optimum focus position.

7. The method as claimed in claim 6, wherein, in order to determine the optimum focus position, the maximum of the squared derivations of each image of the structure is interpolated as a function of the focus position.

8. The method as claimed in claim 1, wherein in step a) the image comprising the reference structure is provided by recording an image of a further structure on the carrier.

9. The method as claimed in claim 1, wherein in step a) the image is provided by recording several spaced apart structures, causing the recorded structures to overlap and arithmetically weighting the overlapping structures.

10. A method for determining the width of a structure comprising a left and a right edge on a carrier, said method comprising the steps of:
    a) providing an image of a reference structure having a left and a right edge, with the width of the reference structure being known;
    b) recording an image of the structure on the carrier;
    c) superimposing the two images to form one superimposed image;
    d) determining the image distance of the left edges of both structures in the superimposed image;
    e) shifting the two left edges in the superimposed image relative to one another, depending on the determined image distance of the left edges;
    f) checking whether the determined image distance of the left edges is below a predetermined maximum value;
    wherein, if the image distance of the left edges is below the maximum value, the method is continued in step g),
    and, if the image distance of the left edges is not below the maximum value, steps d)-f) are repeated, taking into account the determined image distance/distances of the left edges;
    g) determining the image distance of the right edges of both structures in the superimposed image;
    h) shifting the two right edges in the superimposed image relative to one another, depending on the determined image distance of the right edges;
    i) checking whether the determined image distance of the right edges is below a predetermined maximum value;
    wherein, if the image distance of the right edges is below the maximum value, the method is continued in step j),
    and, if the image distance of the right edges is not below the maximum value, steps g)-i) are repeated, taking into account the determined image distance/distances of the right edges;
    j) determining the width of the structure on the basis of the known width of the reference structure and of the edges' image distances determined in steps d) and g).

11. The method as claimed in claim 10, wherein in steps d) and g) the image distance of the edges is respectively determined by means of a two-dimensional correlation.

12. The method as claimed in claim 11, wherein in steps d) and g) a correlation matrix is computed and the image distance of the edges is determined by minimizing the anti-symmetry of the correlation matrix.

13. The method as claimed in claim 11, wherein the absolute maximum of correlation is determined in steps d) and g) by an approximation method so as to determine the image distance of the edges.

14. The method as claimed in claim 10, wherein in step b) several images of the structure are recorded with different focuses, and steps c)-i) are carried out for each of the recorded images, and wherein, in step j), the width of the structure is determined on the basis of the known width of the reference structure and of the edges' image distances determined in steps d) and g) for all images of the structure, with the different focuses.

15. The method as claimed in claim 14, wherein in step j) an optimum focus position for the recording of the structure is derived from the images of the structure, and the width of the structure is determined from the edges' image distances determined in steps d) and i), taking into account the optimum focus position.

16. The method as claimed in claim 15, wherein, in order to determine the optimum focus position, the maximum of the squared derivations of each edge of the structure is interpolated as a function of the focus position.

17. The method as claimed in claim 10, wherein in step a) the image comprising the reference structure is provided by recording an image of a further structure on the carrier.

18. The method as claimed in claim 10, wherein in step a) the image is provided by recording several spaced apart structures, causing the recorded structures to overlap and arithmetically weighting the overlapping structures.

19. An apparatus for determining the position of a structure on a carrier, relative to a reference point of the carrier, on the basis of a provided image comprising a reference structure and of an image of the structure on the carrier, said image having been recorded by a recording device at a known recording position relative to the reference point, wherein the apparatus comprises an evaluation module (7) carrying out the following steps:
   a) superimposing the two images to form one superimposed image;
   b) determining the image distance of the two structures in the superimposed image;
   c) shifting the two structures in the superimposed image relative to one another, depending on the determined image distance;
   d) checking whether the determined image distance is below a predetermined maximum value;
   wherein the evaluating module (7) proceeds to step e) if the image distance is below the maximum value,
   and repeats steps b)-d), taking into account the determined image distance/distances, if the image distance is not below the maximum value;
   e) determining the position of the structure relative to the reference point, on the basis of the known recording position and of the image distance/image distances determined in step(s) b).

20. An apparatus for determining the width of a structure comprising a left and a right edge on a carrier, on the basis of a provided image of a reference structure comprising a left and a right edge, the width of the reference structure being known, and of a recorded image of the structure on the carrier, wherein the apparatus comprises an evaluation module (7) carrying out the following steps:
   a) superimposing the two images to form one superimposed image;
   b) determining the image distance of the left edges of both structures in the superimposed image;
   c) shifting the two left edges in the superimposed image relative to one another, depending on the determined image distance of the left edges;
   d) checking whether the determined image distance of the left edges is below a predetermined maximum value;
   wherein the evaluating module (7) proceeds to step e) if the image distance of the left edges is below the maximum value,
   and repeats steps b)-d), taking into account the determined image distance/distances of the left edges, if the image distance of the left edges is not below the maximum value;
   e) determining the image distance of the right edges of both structures in the superimposed image;
   f) shifting the two right edges in the superimposed image relative to one another, depending on the determined image distance of the right edges;
   g) checking whether the determined image distance of the right edges is below a predetermined maximum value;
   wherein the evaluating module (7) proceeds to step h) if the image distance of the right edges is below the maximum value,
   and repeats steps e)-g), taking into account the determined image distance/distances of the right edges, if the image distance of the right edges is not below the maximum value;
   h) determining the width of the structure on the basis of the known width of the reference structure and of the edges' image distances determined in steps b) and e).

21. A position determining mark, which has a greater overall length of its edges as compared to a previously known mark comprising two intersecting, line-shaped portions which define a surrounding surface region;
   wherein the mark is suitable as a structure for a method for determining the position of the structure on a carrier, relative to a reference point of the carrier, said method comprising the steps of:
   a) providing an image including a reference structure;
   b) recording an image of the structure on the carrier by means of a recording device, with a known recording position relative to the reference points;
   c) superimposing the two images to form one superimposed image;
   d) determining the image distance of the two structures in the superimposed image;
   e) shifting the two structures in the superimposed image relative to one another, depending on the determined image distance;
   f) checking whether the determined image distance is below a predetermined maximum value;
   wherein, if the image distance is below the maximum value, the method is continued in step g),
   and, if the image distance is not below the maximum value, steps d)-f) are repeated, taking into account the determined image distance/image distances; and
   g) determining the position of the structure relative to the reference point, on the basis of the recording position in step b) and of the image distance/image distances determined in step(s) d).

22. The mark as claimed in claim 21, wherein the mark comprises several elbow structures, several nested, ring-shaped structures, or is provided as a grid respectively comprising several line-shaped portions in two different directions.

* * * * *

UNITED STATES PATENT AND TRADEMARK OFFICE
CERTIFICATE OF CORRECTION

PATENT NO. : 8,369,605 B2
APPLICATION NO. : 12/518288
DATED : February 5, 2013
INVENTOR(S) : Michael Arnz et al.

Page 1 of 1

It is certified that error appears in the above-identified patent and that said Letters Patent is hereby corrected as shown below:

ON THE TITLE PAGE:

Item (57), ABSTRACT, line 17, delete "distances:" and insert -- distances; --.

IN THE SPECIFICATIONS:

Col. 4, line 33, delete "$B_{m,n} \propto \hat{A}_{m,n}$," and insert -- $B_{m,n} \propto \hat{A}_{m,n}$ --.

Col. 5, line 22, delete "$(\hat{m}, \hat{n})$" and insert -- $(\hat{m}, \hat{n})$ --.

Signed and Sealed this
Seventh Day of May, 2013

Teresa Stanek Rea
*Acting Director of the United States Patent and Trademark Office*